(12) United States Patent
Hampton

(10) Patent No.: US 8,481,359 B2
(45) Date of Patent: *Jul. 9, 2013

(54) METHODS OF FORMING A PHASE CHANGE MATERIAL

(75) Inventor: Keith R. Hampton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,971

(22) Filed: Sep. 13, 2012

(65) Prior Publication Data

US 2013/0017664 A1     Jan. 17, 2013

Related U.S. Application Data

(60) Continuation of application No. 13/008,173, filed on Jan. 18, 2011, now Pat. No. 8,319,203, which is a division of application No. 12/191,446, filed on Aug. 14, 2008, now Pat. No. 7,888,165.

(51) Int. Cl.
*H01L 21/00* (2006.01)
(52) U.S. Cl.
USPC ..................................... 438/95; 257/E31.029
(58) Field of Classification Search
USPC .............. 438/102, 95; 257/E31.027, E31.029
See application file for complete search history.

(56) References Cited

U.S. PATENT DOCUMENTS

| | | | |
|---|---|---|---|
| 5,296,716 A | 3/1994 | Ovshinsky et al. | |
| 6,210,770 B1 | 4/2001 | Kikuchi et al. | |
| 6,888,155 B2 | 5/2005 | Campbell | |
| 7,321,130 B2 | 1/2008 | Lung et al. | |
| 7,371,429 B2 | 5/2008 | Lee et al. | |
| 7,834,342 B2 | 11/2010 | Hampton | |
| 7,888,165 B2 * | 2/2011 | Hampton | 438/95 |
| 8,124,956 B2 | 2/2012 | Hampton | |
| 2005/0169070 A1 | 8/2005 | Reinberg et al. | |

(Continued)

FOREIGN PATENT DOCUMENTS

| | | |
|---|---|---|
| JP | 2006182781 A | 7/2006 |
| JP | 2007080978 A | 3/2007 |

(Continued)

OTHER PUBLICATIONS

Ahn et al., Highly Manufacturable High Density Phase Change Memory of 64Mb and Beyond, Adv. Technol. Dev., Samsung Electron. Co., Ltd., Electron Devices Meeting, 2004, IEDM Technical Digest, Dec. 13-15, 2004, pp. 907-910.

(Continued)

*Primary Examiner* — Thao Le
(74) *Attorney, Agent, or Firm* — TraskBritt

(57) ABSTRACT

Methods of forming a phase change material are disclosed. The method includes forming a chalcogenide compound on a substrate and simultaneously applying a bias voltage to the substrate to alter the stoichiometry of the chalcogenide compound. In another embodiment, the method includes positioning a substrate and a deposition target having a first stoichiometry in a deposition chamber. A plasma is generated in the deposition chamber to form a phase change material on the substrate. The phase change material has a stoichiometry similar to the first stoichiometry. A bias voltage is applied to the substrate to convert the stoichiometry of the phase change material to a second stoichiometry. A phase change material, a phase change random access memory device, and a semiconductor structure are also disclosed.

20 Claims, 5 Drawing Sheets

U.S. PATENT DOCUMENTS

| | | | |
|---|---|---|---|
| 2006/0097240 A1 | 5/2006 | Lowrey et al. | |
| 2006/0113520 A1 | 6/2006 | Yamamoto et al. | |
| 2006/0172067 A1* | 8/2006 | Ovshinsky et al. | 427/248.1 |
| 2006/0172083 A1 | 8/2006 | Lee et al. | |
| 2006/0209495 A1 | 9/2006 | Lee et al. | |
| 2007/0095651 A1 | 5/2007 | Ye et al. | |
| 2007/0099332 A1 | 5/2007 | Kardokus et al. | |
| 2007/0102283 A1 | 5/2007 | Won et al. | |
| 2007/0108430 A1 | 5/2007 | Lung | |
| 2007/0170413 A1 | 7/2007 | Matsui et al. | |
| 2007/0181867 A1 | 8/2007 | Hewak et al. | |
| 2007/0246782 A1 | 10/2007 | Philipp et al. | |
| 2007/0281420 A1 | 12/2007 | Lai et al. | |
| 2007/0287252 A1 | 12/2007 | Allen | |
| 2008/0006811 A1 | 1/2008 | Philipp et al. | |
| 2008/0026574 A1 | 1/2008 | Brcka | |
| 2008/0055969 A1 | 3/2008 | Liu | |
| 2008/0075843 A1 | 3/2008 | Kuh et al. | |
| 2008/0075844 A1 | 3/2008 | Ha et al. | |
| 2008/0099326 A1 | 5/2008 | Ye et al. | |
| 2008/0099791 A1 | 5/2008 | Lung | |
| 2008/0102560 A1 | 5/2008 | Hamamjy et al. | |
| 2008/0105862 A1 | 5/2008 | Lung et al. | |
| 2008/0258128 A1 | 10/2008 | Kuh et al. | |
| 2008/0280440 A1 | 11/2008 | Chang | |
| 2008/0314738 A1* | 12/2008 | Gopalakrishnan et al. | 204/247.4 |
| 2008/0314739 A1* | 12/2008 | Gopalakrishnan et al. | 204/247.4 |
| 2009/0022883 A1* | 1/2009 | Ovshinsky et al. | 427/80 |
| 2009/0039333 A1 | 2/2009 | Chang et al. | |
| 2010/0038614 A1 | 2/2010 | Hampton | |
| 2010/0041907 A1* | 2/2010 | Mitzi et al. | 556/64 |
| 2010/0051895 A1 | 3/2010 | Hampton | |
| 2010/0203709 A1* | 8/2010 | Czubatyj | 438/478 |
| 2010/0314601 A1* | 12/2010 | Lee | 257/4 |
| 2011/0049456 A1* | 3/2011 | Lung et al. | 257/2 |
| 2012/0170359 A1* | 7/2012 | Wu et al. | 365/163 |

FOREIGN PATENT DOCUMENTS

| | | |
|---|---|---|
| WO | 2007029938 A1 | 3/2007 |
| WO | 2007133837 A3 | 3/2008 |
| WO | 2008057916 A2 | 5/2008 |

OTHER PUBLICATIONS

Ding et al., A New PVD Sputtering Source for Metal Gate Application, Solid-State and Integrated Circuit Technology, 2006, ICSICT '06 8th International Conference, Oct. 2006, pp. 509-512.

Herklotz et al., Technological Advances in Physical Vapor Deposition, IEEE Transactions on Components, Hybrids, and Manufacturing Technology, vol. 6, No. 2, Jun. 1983, pp. 173-180.

Kikuchi et al., Preparation of Oxygen-Doped and Nitrogen-Doped Ge-Sb-Te System Thin Film for Phase Change Random Access Memory by RF Magnetron Sputtering, Non-Volatile Memory Technology Symposium, 2006, NVMTS 2006 7the Annual, Nov. 5-8, 2006, pp. 81-83.

Morales-Sánchez et al., Influence of Oxygen on the Crystallization Process in Ge:Sb:Te:O Films, Electrical and Electronics Engineering, 2006 3rd International Conference, Sep. 2006, pp. 1-4.

Niinistö, Advanced Thin Films for Electronics and Opto-Electronics by Atomic Layer Epitaxy, Semiconductor Conference, 2000, CAS 2000 Proceedings, Oct. 10-14, 2000, vol. 1, pp. 33-42.

* cited by examiner

METHODS OF FORMING A PHASE CHANGE MATERIAL

CROSS-REFERENCE TO RELATED APPLICATIONS

This application is a continuation of U.S. patent application Ser. No. 13/008,173, filed Jan. 18, 2011, now U.S. Pat. No. 8,319,203, issued Nov. 27, 2012, which is a divisional of U.S. patent application Ser. No. 12/191,446, filed Aug. 14, 2008, now U.S. Pat. No. 7,888,165, issued Feb. 15, 2011, which application is related to U.S. patent application Ser. No. 12/204,510, filed Sep. 4, 2008, now U.S. Pat. No. 7,834,342, issued Nov. 16, 2010. This application is also related to U.S. patent application Ser. No. 12/909,665, filed Oct. 21, 2010, now U.S. Pat. No. 8,124,956, issued Feb. 28, 2012, and to U.S. patent application Ser. No. 13/347,919, filed Jan. 11, 2012, pending. The disclosure of each of the above-identified applications and patents is hereby incorporated herein by this reference in its entirety.

TECHNICAL FIELD

Embodiments of the present invention relate to methods of producing a phase change material having a desired stoichiometry. More specifically, the present invention, in various embodiments, relates to producing a phase change material having a stoichiometry that is different from the stoichiometry of a target used in its formation, a heterogeneous phase change material, and structures incorporating the phase change material.

BACKGROUND

Phase change materials are known in the art and include compounds formed from germanium (Ge), antimony (Sb), and tellurium (Te), which are known as GST materials. The phase change material is capable of being reversibly electrically switched between an amorphous state and a crystalline state. The phase change material is electrically writable and erasable and has been used in electronic memory applications. When the GST material is in the amorphous state, it is said to be "reset," while the GST material is said to be "set" in the crystalline state. GST materials have been used in phase change random access memory ("PCRAM") devices to provide non-volatile memory with long data retention. PCRAM devices rely on the electrically bistable status of resistance differences between the amorphous and crystalline states of the GST material.

One GST material used in PCRAM devices is $Ge_2Sb_2Te_5$. However, during operation of the PCRAM device, changes in the stoichiometry of the GST material have been observed. In other words, the GST material, as deposited, includes different relative amounts of Ge, Sb, and Te than the GST material after operation of the PCRAM device. In addition, the stoichiometry of the Ge, Sb, and Te has been reported to change in an active region or contact region of the PCRAM device after repeated operation. While the relative amount of Ge in the $Ge_2Sb_2Te_5$ in the active region remained constant, the $Ge_2Sb_2Te_5$ became Sb-rich and Te-deficient. However, regions of the $Ge_2Sb_2Te_5$ not subject to the switching maintained their original stoichiometry.

It would be desirable to form a phase change material having a desired stoichiometry, where the stoichiometry differs from that of a deposition target used to form the phase change material.

DETAILED DESCRIPTION

Figure 1:
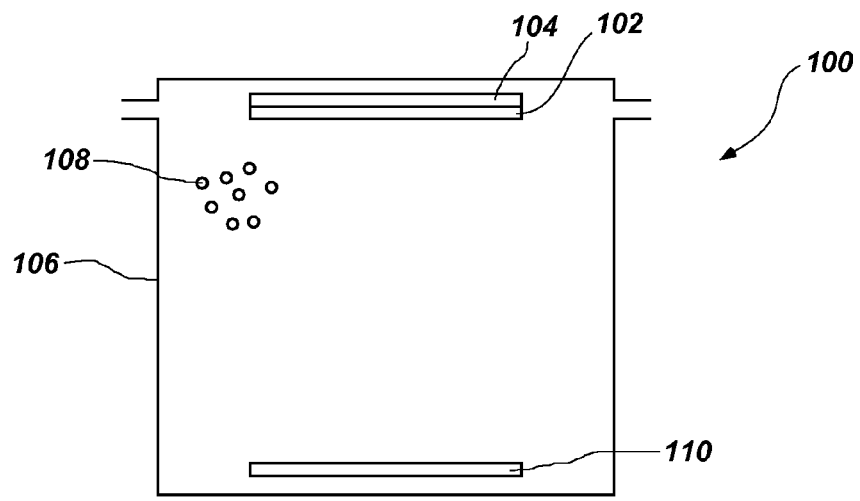
FIG. 1 is a schematic illustration of a deposition system in accordance with an embodiment of the invention.

A method of forming a phase change material having a desired stoichiometry or ratio of elements is disclosed. As used herein, the phrase "phase change material" means and includes a chalcogenide compound formed from a chalcogen ion and at least one electropositive element. By applying a bias voltage to a substrate, upon which the phase change material is deposited, as the phase change material is deposited, the stoichiometry of the elements of the phase change material may be controlled or adjusted. As such, the phase change material having the desired stoichiometry is produced. As used herein, the term "bias voltage" means and includes a fixed or pulsed DC voltage applied to the substrate through a chuck or support. The bias voltage to be applied to the substrate may be achieved by setting a bias voltage at a specified current, setting a bias current at a specified voltage, setting a bias power as a combination of voltage and current, or combinations thereof. For convenience, the bias voltage may be described herein as being applied to the substrate, when in actuality, the bias voltage is applied to the substrate through the chuck. The bias voltage refers to the voltage measured between the substrate and a plasma. Application of the bias voltage during deposition of the phase change material may cause sputtering of at least a portion of at least one element of the phase change material, resulting in the phase change material having a reduced amount of that element. Since the stoichiometry of the elements in the phase change material is controlled as the phase change material is deposited, a single deposition target may be used to form phase change materials having different stoichiometries. In addition, the method may be used to form a phase change material having a heterogeneous or a substantially homogeneous composition throughout its thickness.

The following description provides specific details, such as material types, material thicknesses, and processing conditions in order to provide a thorough description of embodiments of the present invention. However, a person of ordinary skill in the art will understand that the embodiments of the present invention may be practiced without employing these specific details. Indeed, the embodiments of the present invention may be practiced in conjunction with conventional fabrication techniques employed in the industry. In addition, the description provided herein does not form a complete process flow for manufacturing a PCRAM device, and the PCRAM device described below does not form a complete semiconductor device. Only those process acts and structures necessary to understand the embodiments of the present invention are described in detail below. Additional acts to form a complete semiconductor device including the PCRAM device may be performed by conventional techniques.

The illustrations presented herein are not meant to be actual views of any particular systems, phase change materials, or PCRAM devices, but are merely idealized representations that are employed to describe embodiments of the present invention. Elements and features common between figures may retain the same numerical designation.

The chalcogen ion of the phase change material may be oxygen (O), sulfur (S), selenium (Se), Te, or polonium (Po). In one embodiment, the chalcogen ion is Te. The electropositive element may include, but is not limited to, nitrogen (N), silicon (Si), nickel (Ni), gallium (Ga), Ge, arsenic (As), silver (Ag), indium (In), tin (Sn), Sb, gold (Au), lead (Pb), bismuth (Bi), or combinations thereof. In one embodiment, the electropositive elements are Ge and Sb. The chalcogenide compound may be a binary, ternary, or quaternary alloy of these elements. By way of non-limiting example, the chalcogenide compound may be a compound of Ge, Sb, and Te (a GST material). The GST material may have an empirical formula of $Ge_xSb_{100-(x+y)}Te_y$, where the stoichiometry (in atomic percent) of Ge and Te are indicated by x and y, respectively, and the remainder of the GST material is Sb. By way of non-limiting example, x may be greater than approximately 5 atomic percent but less than approximately 60 atomic percent, such as between approximately 17 atomic percent and approximately 44 atomic percent, and y may be greater than approximately 20 atomic percent but less than approximately 70 atomic percent, such as between approximately 23 atomic percent and approximately 56 atomic percent. By way of non-limiting example, the GST material may be $Ge_{22}Sb_{22}Te_{55}$ (also known as $Ge_2Sb_2Te_5$), $Ge_8Sb_{32}Te_{56}$ (also known as $Ge_1Sb_4Te_7$), $Ge_{14}Sb_{28}Te_{56}$ (also known as $Ge_1Sb_2Te_4$), $Ge_{40}Sb_9Te_{51}$, $Ge_{44}Sb_5Te_{51}$, $Ge_{28}Sb_{27}Te_{45}$, $Ge_{58}Sb_{19}Te_{23}$, $Ge_{17}Sb_{27}Te_{56}$, $Ge_{30}Sb_{17}Te_{53}$, or combinations thereof. While compounds having specific stoichiometries are listed above, the phase change material may include other stoichiometries of Ge, Sb, and Te.

While specific examples herein describe the phase change material as a GST material, the phase change material may be a chalcogenide compound formed from other elements. By way of non-limiting example, the chalcogenide compound may be a compound of Sb and Te, such as $Sb_2Te_3$, a compound of Ge and Te, such as GeTe, a compound of In and Se, such as $In_2Se_3$, a compound of Sn and Te, such as SnTe, a compound of Bi and Te, such as $Bi_2Te_3$, a compound of Sb and Te, such as SbTe, a compound of Sn and Se, such as SnSe, a compound of Ge and Se, such as GeSe, a compound of Au, Ge, Sn, and Te, such as $Au_{25}Ge_4Sn_{11}Te_{60}$, a compound of Ag and Se, such as $Ag_2Se$, or a compound of In and Te, such as InTe. While chalcogenide compounds having specific stoichiometries are listed above, the chalcogenide compound may include the same combination of elements having other stoichiometries.

The substrate upon which the phase change material is formed comprises a conventional silicon substrate or other bulk substrate including a layer of semiconductor material. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor or optoelectronics materials, such as silicon-germanium, germanium, gallium arsenide, or indium phosphide. The material of the substrate may be doped or undoped. The phase change material may also be formed on another material overlying the substrate, depending on the intended application for the phase change material. By way of non-limiting example, if the phase change material is to be used in a PCRAM device, the phase change material may be formed on a titanium nitride (TiN), titanium aluminum nitride (TiAlN), or tungsten (W) material overlying the substrate.

To achieve the desired stoichiometry of the phase change material on the substrate, the phase change material may be deposited by a deposition technique in which a plasma is capable of being formed and a bias voltage is capable of being applied to the substrate. By way of non-limiting example, the deposition technique may be a physical vapor deposition ("PVD") technique or a chemical vapor deposition ("CVD") technique. PVD includes, but is not limited to, sputtering, evaporation, or ionized PVD. Such deposition techniques are known in the art and, therefore, are not described in detail herein. However, other deposition techniques in which a plasma is capable of being formed and a bias voltage is capable of being applied to the substrate may also be used, such as pulsed laser deposition ("PLD"). Alternatively, the phase change material may be formed by another conventional deposition technique, followed by subsequent generation and application of the plasma and the bias voltage.

A system 100 for forming the phase change material 102 on the substrate 104 is illustrated in FIG. 1. The substrate 104 may be positioned or placed on a support or chuck (not shown) of a deposition chamber 106 in which the plasma 108 is capable of being produced and the bias voltage is capable of being applied to the substrate 104. The deposition chamber 106 may be configured to produce the plasma 108 and apply the bias voltage to the substrate 104 during deposition of the phase change material. The plasma 108 produced in the deposition chamber may be an inert plasma produced from a noble gas element, such as a helium, neon, argon, krypton, xenon, or radon. In one embodiment, an argon plasma is generated. As described in more detail below, the plasma 108 may also include nitrogen. The deposition chamber 106 may be configured for applying a bias voltage of up to approximately 500 W to the substrate 104 through the chuck. By way of non-limiting example, the deposition chamber 106 may be a conventional PVD chamber or PVD tool. Since conventional PVD chambers are capable of producing the plasma and applying the bias voltage to the chuck, a conventional PVD chamber may be used in the present invention without substantial modification thereto. The deposition chamber 106 may also be configured for controlling the temperature of the chuck, as explained below. In one embodiment, the deposition chamber is an ENTRON® system, which is commercially available from Ulvac Technologies, Inc. (Methuen, Mass.).

The deposition chamber 106 may also include a deposition target 110 formed from a chalcogenide material having the same, or substantially similar, combination of elements as those of the desired phase change material 102. The deposition target 110 may be selected by a person of ordinary skill in the art depending on the phase change material 102 to be formed. By way of non-limiting example, the deposition target 110 may be a $Ge_2Sb_2Te_5$ target, known as a 225 target, or a $Ge_1Sb_4Te_7$ target, known as a 147 target. Such deposition targets 110 are commercially available, such as from Nikko Materials USA, Inc. (Chandler, Ariz.), MMC Technology, Inc. (San Jose, Calif.), and Umicore Group (Brussels, Belgium). In one embodiment, the deposition target 110 is a 225 target.

After positioning the substrate 104 on the chuck, the plasma 108 may be generated in the deposition chamber 106 and the bias voltage may, simultaneously, be applied to the substrate 104. The conditions, such as temperature and pressure, for generating and maintaining the plasma 108 in the deposition chamber 106 are conventional and, therefore, are not described in detail herein. The bias voltage applied to the substrate 104 may be up to approximately 500 W, such as from approximately 25 W to approximately 200 W. As the deposition target 110 is bombarded with the plasma 108, atoms of the deposition target 110 are sputtered from the target surface and deposited on a surface of the substrate 104, forming a coating of the phase change material 102 on the surface of the substrate 104. The phase change material, as initially deposited, may have approximately the same stoichiometry as that of the deposition target 110. In other words, the phase change material coating the surface of the substrate 104 may, initially and momentarily, have approximately the same stoichiometry of elements as that of the deposition target 110. However, by applying the bias voltage as the phase change material 102 is deposited, a portion of the chalcogen in the phase change material 102 may be sputtered, resulting in the phase change material 102 having a reduced content of the chalcogen compared to the chalcogen content in the as-deposited, phase change material. For clarity and convenience, the phase change material as initially deposited is not illustrated. As such, the stoichiometry of the resulting phase change material 102 may be different than the stoichiometry of the deposition target 110.

The phase change material 102 on the substrate 104 may be formed in an amorphous state or in a crystalline state by adjusting the chuck temperature. If the chuck temperature is maintained at approximately room temperature during the deposition of the phase change material 102, the phase change material 102 may be deposited in an amorphous state. At a deposition temperature above room temperature, the phase change material 102 may be deposited in a crystalline state. By way of non-limiting example, the phase change material 102 is deposited in crystalline state. Alternatively, a portion of the phase change material 102 may be deposited in the amorphous state and another portion of the phase change material 102 may be deposited in the crystalline state.

Without being bound by any theory, it is believed that applying the bias voltage to the substrate 104 during deposition of the phase change material 102 may pull ions generated by the plasma 108, such as argon ions, toward the substrate 104. As the plasma ions are accelerated toward the as-deposited material, the plasma ions may collide with the as-deposited phase change material 102. Contact between the plasma ions and the as-deposited phase change material 102 may cause the individual elements of the as-deposited phase change material 102 to redistribute or be sputtered away. By way of non-limiting example, as the phase change material 102 is being deposited, the plasma 108 may accelerate into the as-deposited phase change material 102, causing atoms of the as-deposited phase change material 102, such as the chalcogen atoms, to be sputtered away. Therefore, applying the bias voltage to the substrate 104 may remove the chalcogen atoms from the as-deposited phase change material 102, producing a phase change material 102 having a reduced amount of the chalcogen relative to the amount of the chalcogen in the as-deposited phase change material 102. By increasing the bias voltage applied to the substrate 104, the chalcogen content of the phase change material 102 may decrease.

By forming the phase change material 102 having the reduced amount of chalcogen, the resistance of the phase change material 102, and the overall resistance of a device in which the phase change material 102 is present, may be reduced. Accordingly, by tailoring the amount of chalcogen in the phase change material 102, the resistance of the phase change material 102 may be tailored. Furthermore, the decreased chalcogen content may enable more consistent switching of the phase change material 102.

In one embodiment, the phase change material 102 is a GST material having the general empirical formula of: $Ge_xSb_{100-(x+y)}Te_y$, where x and y are as previously defined. By way of non-limiting example, if the deposition target 110 is a $Ge_2Sb_2Te_5$ deposition target, the as-deposited phase change material 102 is, at least originally, $Ge_2Sb_2Te_5$. However, application of the bias voltage to the substrate 104 causes Te atoms to be sputtered away, leading to a decreased Te content in the phase change material 102. Changing the amount of Te in the GST material changes the electrical resistance of the GST material and the overall resistance of a device in which the GST material is used. Consequently, by tailoring the amount of Te in the GST material, the resistance of the GST material may be tailored.

The GST material may be deposited in a crystalline state by maintaining the temperature in the deposition chamber at above room temperature. In one embodiment, the as-deposited phase change material 102 is a crystalline GST material since the resistance of the crystalline GST material is on the order of kiloOhms (kΩ), while the resistance of the amorphous GST material is on the order of megaOhms (MΩ).

The bias voltage applied to the substrate 104 may be held constant or varied to form a substantially homogenous phase change material 102 or a substantially heterogeneous phase change material 102. The phase change material 102 formed on the substrate 104 may be substantially homogeneous in that the stoichiometry of the phase change material 102 is constant, or of a single stoichiometry, throughout its thickness. The substantially homogeneous phase change material 102 may be formed by applying a constant bias voltage to the substrate 104 as the phase change material 102 is deposited. By way of non-limiting example, if a bias voltage of approximately 95 W is applied to the substrate 104 while depositing a GST material by PVD using a 225 deposition target, a GST material having approximately 49 atomic percent Te, approximately 24 atomic percent Ge, and approximately 26 atomic percent Sb is produced. In contrast, if a bias voltage of 0 W is applied, a GST material having approximately 57 atomic percent Te, approximately 20 atomic percent Ge, and approximately 22 atomic percent Sb is produced.

Figure 2:
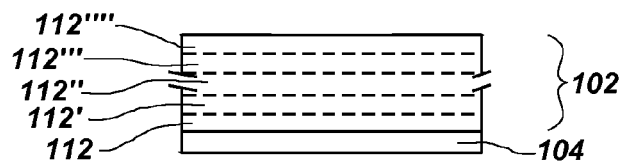
FIG. 2 is a schematic illustration of a heterogeneous phase change material formed in accordance with an embodiment of the invention.

Alternatively, the stoichiometry of the phase change material 102 formed on the substrate 104 may be substantially heterogeneous. The phase change material 102 may be substantially heterogeneous in that the phase change material 102 may include a stepwise change in stoichiometry throughout its thickness or may include a substantially continuous gradient or change in stoichiometry throughout its thickness. As illustrated in FIG. 2, the heterogeneous phase change material 102 may be viewed as being formed of a plurality of portions 112, 112', 112'', 112''', 112'''' (i.e., 112-112'''') (indicated using dashed lines), each portion of the plurality of portions 112-112'''' having a different stoichiometry. While FIG. 2 illustrates that the heterogeneous phase change material 102 includes five portions 112, 112', 112'', 112''', 112'''', the heterogeneous phase change material 102 may include fewer or more portions 112-112''''. By way of non-limiting example, a first portion 112 of the phase change material 102 may have a first stoichiometry, a second portion 112' of the phase change material 102 may have a second stoichiometry, a third portion 112' of the phase change material 102 may have a third stoichiometry, a fourth portion 112''' of the phase change material 102 may have a fourth stoichiometry, and a fifth portion 112'''' of the phase change material 102 may have a fifth stoichiometry. For the phase change material 102 to be heterogeneous, at least one of the portions 112-112"" of the phase change material 102 may have the same stoichiometry as another of the portions 112-112"" as long as at least one of the portions 112-112"" has a different stoichiometry than another of the portions 112-112"". The plurality of portions 112-112"" of the phase change material 102 may be substantially indistinguishable from one another by visual detection. However, the differences in stoichiometry may be detected by conventional spectroscopy or spectrometry techniques.

The heterogeneous phase change material 102 having a stepwise change in stoichiometry may be formed by making stepwise changes to the bias voltage applied to the substrate 104 during deposition of the phase change material 102. By way of non-limiting example, if the phase change material 102 is to be a bilayer composition (i.e., include two stoichiometries), two bias voltages may be applied to the substrate 104 in a stepwise manner. A first bias voltage may be applied to the substrate 104 and maintained for a desired amount of time, followed by applying a second bias voltage to the substrate 104 and maintaining the second bias voltage for a certain amount of time. The second bias voltage may be increased or decreased compared to the first bias voltage, depending on the desired stoichiometries in the resulting phase change material 102. To form a phase change material 102 having three or more different stoichiometries, additional bias voltages may be applied to the substrate 104 in a stepwise manner as the phase change material 102 is deposited.

The heterogeneous phase change material 102 having a substantially continuous gradient in the stoichiometry of the respective elements may be formed by making a substantially continuous change to the bias voltage applied to the substrate 104 during deposition of the phase change material 102. By way of non-limiting example, if a substantially continuous gradient of the phase change material 102 is desired, the bias voltage may be increased or decreased at a substantially constant rate during deposition of the phase change material 102.

Since the stoichiometry of the phase change material 102 may be selected by controlling the bias voltage applied to the substrate 104, a single deposition target 110 may be used to achieve phase change materials 102 having different stoichiometries. In other words, phase change materials 102 of differing stoichiometry may be produced from a single deposition target 110. Previously, using a conventional process to form a phase change material having a desired stoichiometry, a deposition target having a specific, corresponding desired stoichiometry had to be used. As a consequence of this process limitation, different deposition targets had to be purchased to form different phase change materials.

By forming a phase change material 102 having a reduced chalcogen content, a PCRAM device including the phase change material 102 may exhibit improved initial switching and may be operated without substantial conditioning of the device before use. In addition, the phase change material 102 may improve the reliability of the PCRAM device, leading to more consistent switching and greater endurance during the lifetime of the PCRAM device.

The method of producing the phase change material 102 having a reduced chalcogen content may also be utilized with a phase change material 102 formed on the substrate 104 by atomic layer deposition ("ALD"). After forming the phase change material 102 from the chalcogenide compound by ALD, the substrate 104 having the deposited phase change material 102 may be transferred from an ALD chamber to the deposition chamber 106. The plasma 108 may be generated in the deposition chamber 106 and the bias voltage applied to the substrate 104, as previously described, to produce the phase change material 102 having the reduced chalcogen content.

A phase change material 102 including nitrogen therein may also be formed by the above-mentioned method. To form the nitrogen-containing phase change material, the plasma 108 to which the substrate 104 is subjected may include nitrogen ("$N_2$") in combination with the noble gas element. By way of non-limiting example, the substrate 104 may be subjected to a plasma 108 including argon and $N_2$. The bias voltage may be applied to the substrate 104, as previously described, forming the nitrogen-containing phase change material having the reduced chalcogen content. Including nitrogen in the phase change material 102 may improve the switching of a device having the phase change material 102 by reducing the current in the device.

Figure 3:
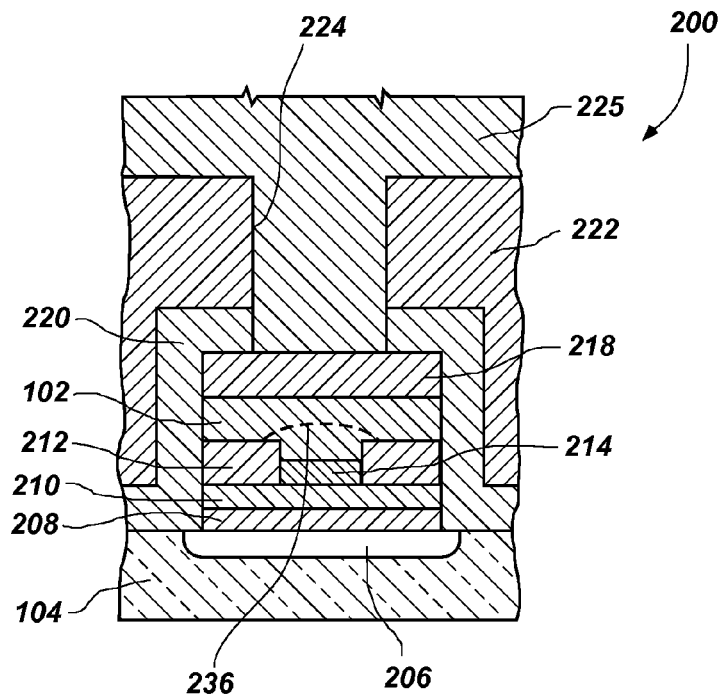
FIGS. 3-13 are cross-sectional views illustrating the fabrication of a PCRAM device in accordance with an embodiment of the invention.

The phase change material 102 may be used in a PCRAM device 200, as illustrated in FIG. 3. While specific examples herein describe and illustrate the phase change material 102 in the PCRAM device 200, the phase change material 102 may be utilized in other PCRAM structures or in a complementary metal-oxide semiconductor ("CMOS") device. The PCRAM device 200 includes a memory matrix or array (not shown) that includes a plurality of memory cells for storing data. The memory matrix is coupled to periphery circuitry (not shown) by a plurality of control lines. The periphery circuitry may include circuitry for addressing the memory cells contained within the memory matrix, along with circuitry for storing data in and retrieving data from the memory cells. The periphery circuitry may also include other circuitry used for controlling or otherwise ensuring the proper functioning of the PCRAM device 200.

The memory matrix includes a plurality of memory cells that are arranged in generally perpendicular rows and columns. The memory cells in each row are coupled together by a respective word line (not shown), and the memory cells in each column are coupled together by a respective digit line 206. Each memory cell includes a word line node that is coupled to a respective word line, and each memory cell includes a digit line node that is coupled to a respective digit line 206. The word lines and digit lines 206 are collectively referred to as address lines. These address lines are electrically coupled to the periphery circuitry so that each of the memory cells can be accessed for the storage and retrieval of information. The memory cell includes a memory element, such as a programmable resistive element, which is coupled to an access device (not shown), such as a diode. The memory element is formed from the phase change material 102. The diode may be a conventional diode, a zener diode, or an avalanche diode, depending upon whether the diode array of the memory matrix is operated in a forward biased mode or a reverse biased mode. The memory element is coupled to the word line, and the access device is coupled to the digit line 206. However, connections of the memory element may be reversed without adversely affecting the operation of the memory matrix.

Figure 4:
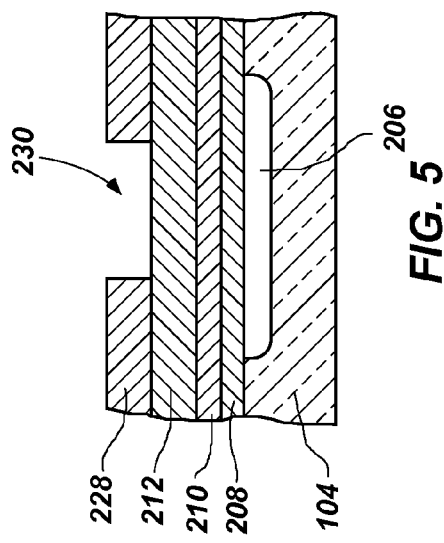

As shown in FIG. 3, the PCRAM device 200 includes substrate 104, digit line 206, n-doped polysilicon material 208, p-doped polysilicon material 210, dielectric material 212, lower electrode 214, phase change material 102, upper electrode 218, insulative material 220, oxide material 222, and contact hole 224 (filled with conductive material 225). The PCRAM device 200 may be formed by conventional techniques. By way of non-limiting example and as illustrated in FIG. 4, the digit lines 206 may be formed in or on the substrate 104. By way of non-limiting example, the digit line 206 may be formed in the substrate 104 as a doped $N^+$ type trench. Access device 226 may be formed on top of the digit line 206. The access device 226 may be a diode, or other device, formed by the n-doped polysilicon material 208 and the p-doped polysilicon material 210. Next, the dielectric material 212 may be formed on top of the p-doped polysilicon material 210. The dielectric material 212 may be formed from a suitable insulative or dielectric material, such as plasma enhanced CVD ("PECVD") $SiO_z$, where z is 1 or 2, PECVD silicon nitride, or standard thermal CVD $Si_3N_4$.

Figure 5:
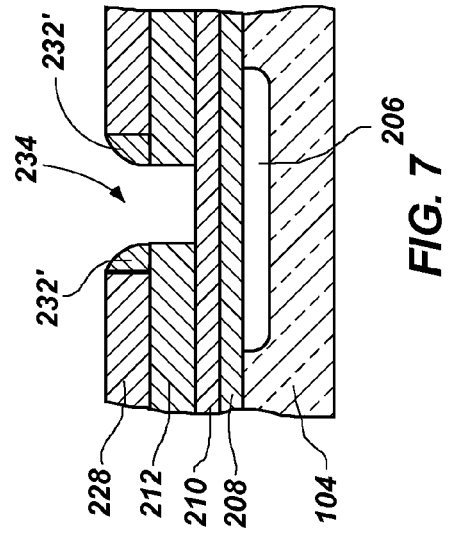
Figure 6:
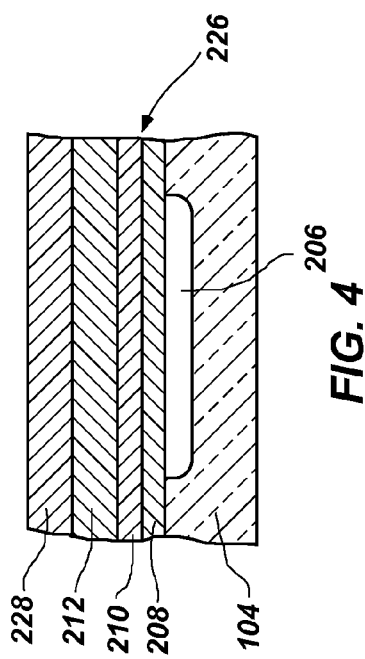

A hard mask 228 may be deposited on top of the dielectric material 212 and patterned to form an opening 230, as illustrated in FIG. 5. A spacer material 232 may be deposited over the hard mask 228 in a conformal fashion so that the upper surface of the spacer material 232 is recessed where the spacer material 232 covers the opening 230, as illustrated in FIG. 6. By way of non-limiting example, a dielectric material, such as CVD amorphous or polycrystalline silicon, may be used as the spacer material 232. The spacer material 232 may be anisotropically etched using a suitable etchant, such as $HBr+Cl_2$. The rate and time of the etch are controlled so that the spacer material 232 may be substantially removed from the upper surface of the hard mask 228 and from a portion of the upper surface of the dielectric material 212 within the opening 230, leaving sidewall spacers 232' within the opening 230.

Figure 7:
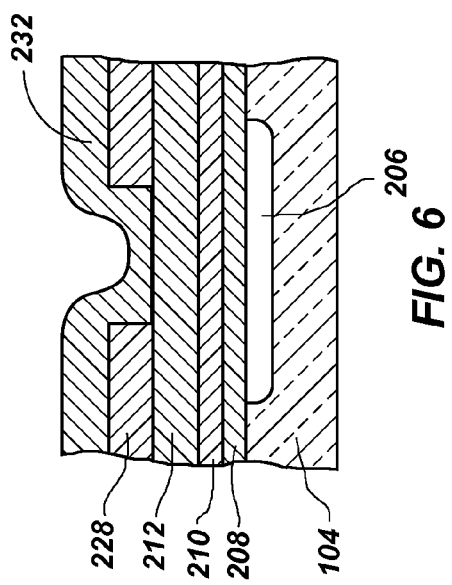
Figure 8:
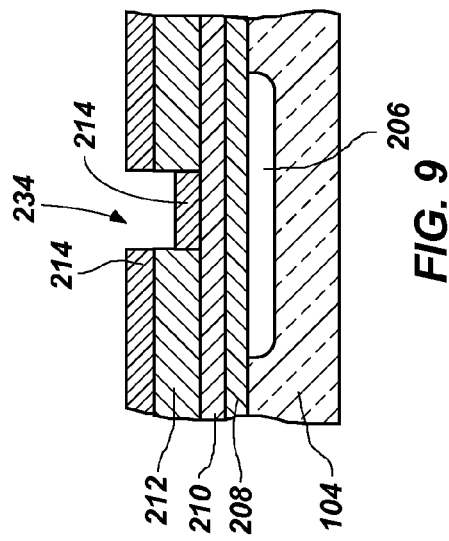
Figure 9:
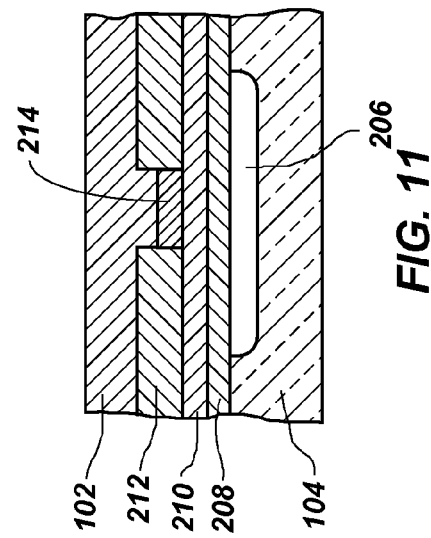
Figure 10:
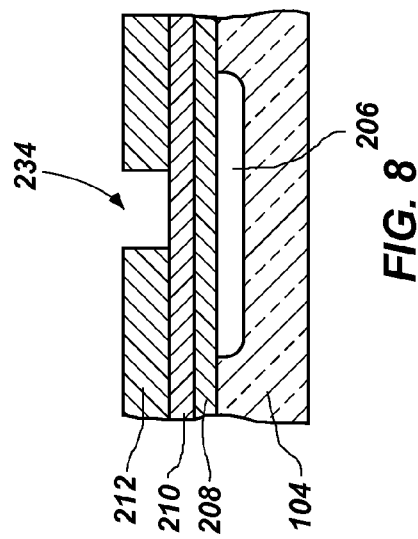

Once the sidewall spacers 232' have been formed, an etchant may be used to form a pore 234 in the dielectric material 212, as illustrated in FIG. 7. The etchant may be an anisotropic etchant that selectively removes the dielectric material 212 bounded by the sidewall spacers 232' until the p-doped polysilicon material 210 is reached. The hard mask 228 and the sidewall spacers 232' may be removed, as illustrated in FIG. 8, such as by etching or by chemical mechanical planarization ("CMP"). The pore 234 may be filled to a desired level with a material suitable to form the lower electrode 214, as illustrated in FIG. 9. The lower electrode 214 may be formed using collimated PVD or another suitable directional deposition technique such that the lower electrode 214 is formed on top of the dielectric material 212 and within the pore 234. The lower electrode 214 on top of the dielectric material 212 may be removed, using CMP, for example, to leave the lower electrode 214 at the bottom of the pore 234, as illustrated in FIG. 10. The lower electrode 214 may be formed from at least one material, and may be formed in at least one layer or other three-dimensional configuration. For instance, a layer of carbon may be used as a barrier material to prevent unwanted migration between the subsequently deposited phase change material 102 and the p-doped polysilicon material 210. A layer of titanium nitride (TiN) may then be deposited upon the layer of carbon to complete the formation of the lower electrode 214. Additional materials that may be used to form the lower electrode 214 include, but are not limited to, TiAlN or W.

Figure 11:
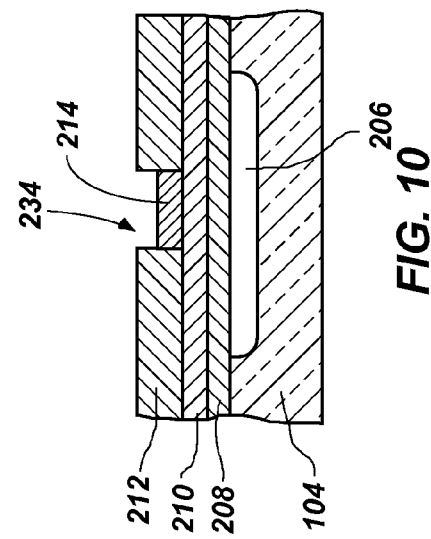
Figure 12:
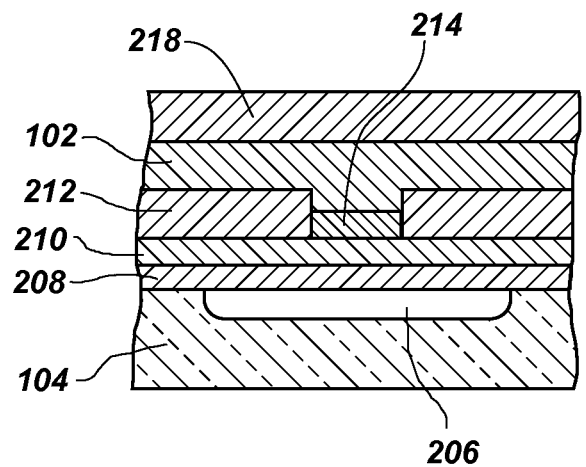
Figure 13:
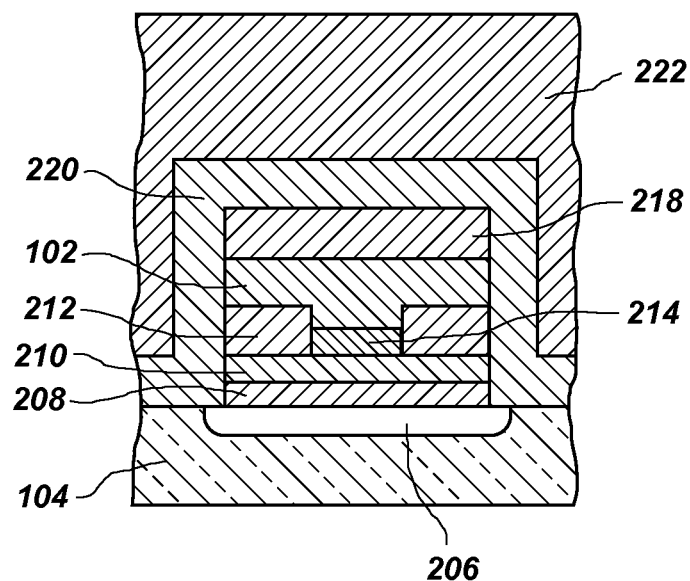

The phase change material 102 may be deposited so that the phase change material 102 contacts the lower electrode 214, as illustrated in FIG. 11. A thickness at which the phase change material 102 is deposited may depend on the size of the lower electrode 214. By way of non-limiting example, if the lower electrode 214 is circular and has a diameter of approximately 40 nm, the phase change material 102 may be deposited at a thickness of from approximately 400 Å to approximately 2000 Å. The phase change material 102 may be a substantially homogeneous material or a heterogeneous material, as previously described. The upper electrode 218 may be deposited on top of the phase change material 102, as illustrated in FIG. 12. The upper electrode 218 may be formed from TiN or other suitable material. After the upper electrode 218, the phase change material 102, the dielectric material 212, and the access device have been patterned and etched to form an individual memory cell, the insulative material 220, such as silicon nitride, is deposited over the structure, as illustrated in FIG. 13. The oxide material 222 may then be deposited over the insulative material 220. The oxide material 222 may be patterned and the contact hole 224 formed through the oxide material 222 and the insulative material 220. The contact hole 224 may then be filled with a conductive material 225 to form the word line and produce the PCRAM device 200 shown in FIG. 3.

At least a portion of the phase change material 102 may be capable of being reversibly electrically switched between a first state and a second state, where the first state and the second state differ in at least one property that is detectable including, but not limited to, electrical resistivity, electrical conductivity, optical transmissivity, optical absorption, optical refraction, optical reflectivity, morphology, surface topography, relative degree of order, relative degree of disorder, or combinations thereof. By way of non-limiting example, the phase change material 102 may be configured to electrically switch between an amorphous state and a crystalline state, between a first amorphous state and a second amorphous state, or between a first crystalline state and a second crystalline state, where the first and second states have at least one of the different detectable properties mentioned above, such as different resistivities. As used herein, the phrase "amorphous state" refers to a state in which the phase change material 102 has a less ordered, or more disordered structure or arrangement of atoms, while the phrase "crystalline state" means and includes a state in which the phase change material 102 has a more ordered, or less disordered structure or arrangement of atoms. The phase change material 102 may be switched between the first and second states in a time period of approximately a few nanoseconds with the input of picojoules of energy. By way of non-limiting example, the phase change material 102 may be switched from the amorphous state to the crystalline state in an amount of time ranging from approximately 50 nsec to approximately 500 nsec. The phase change material 102 may be switched from the crystalline state to the amorphous state in an amount of time ranging from approximately 5 nsec to approximately 100 nsec. The phase change material 102 may be switchable between the first and second states for a sufficient number of times without exhibiting substantial changes in at least one of the detectable properties mentioned above. In one embodiment, the phase change material 102 is the GST material and is switched between an amorphous GST material and a crystalline GST material.

The PCRAM device 200 may utilize a high current pulse to switch the phase change material 102 to the first state and a low current pulse to switch the phase change material 102 to the crystalline state. By way of non-limiting example, if the phase change material 102 is the GST material, the high current pulse may switch the GST material to the amorphous state, while the low current pulse may switch the GST material to the crystalline state. The GST material may be electrically switched between the amorphous state and the crystalline state at a high switch rate or high switch speed and a low energy level.

In use and operation, a voltage is applied between the word line and the digit line 206 of the PCRAM device 200. The current is applied to heat up a contact region 236 (FIG. 3) or active region between the phase change material 102 and the lower electrode 214. During the high current pulse, the phase change material 102 is subject to a temperature above its melting point, causing at least a portion of the phase change material 102 to convert from its crystalline state to the amorphous state. The portion of the phase change material 102 converted from the crystalline state to the amorphous state is indicated in FIG. 3 with dashed lines and corresponds to the contact region 236. The phase change material 102 remains in the amorphous state until the low current pulse is applied of sufficient duration to convert the phase change material 102 to the crystalline state. A current density of from approximately $1\times10^5$ amperes/cm$^2$ to approximately $1\times10^7$ amperes/cm$^2$ is used to switch the phase change material 102 between the amorphous and crystalline states in the contact region 236. To obtain this current density in a commercially viable PCRAM device 200 having at least 64 million memory cells, for instance, the contact region 236 of each memory cell is made as small as possible to minimize the total current drawn by the PCRAM device 200. Heat may be generated in the contact region 236 where the phase change material 102 contacts the lower electrode 214 due to a current supplied through the lower electrode 214. The heat generated by the current may convert the state of the phase change material 102 from amorphous to crystalline.

A SET state of the PCRAM device 200 may be achieved by applying the voltage or current pulse sufficient to raise the temperature of the phase change material 102 in the contact region 236 to below its melting point but above its crystallization temperature. The temperature of the phase change material 102 may be maintained for a sufficient amount of time to enable the atoms to be rearranged into a crystalline state. A RESET state of the PCRAM device 200 may be achieved by applying a voltage or current pulse sufficient to raise the temperature of the phase change material 102 in the contact region 236 to its melting point. The temperature is maintained for a shorter time than the SET pulse. The SET pulse is typically longer in duration but of lower amplitude than the RESET pulse. The RESET pulse is typically shorter in duration but of higher amplitude than the SET pulse. The actual amplitudes and durations of the pulses depend upon the size of the memory cells and the particular phase change material 102 used in the memory cells. RESET currents for phase change materials 102 used in memory cells typically range from approximately 400 microAmpere (μA) to approximately 600 μA and have durations of from approximately 10 nanoseconds to approximately 50 nanoseconds, whereas SET currents range from approximately 100 μA to approximately 200 μA and have durations of from 50 nanoseconds to approximately 100 nanoseconds.

The phase change material 102 is non-volatile and may maintain the integrity of the information stored in the PCRAM device 200 without the need for periodic refresh signals, and the data integrity of the stored information is not lost when power to the PCRAM device 200 is removed. The phase change material 102 may be directly overwritable so that the PCRAM device 200 need not be erased in order to change information stored within the PCRAM device 200. The phase change material 102 may be electrically switched between the amorphous state and the crystalline state at a high switch rate or switch speed and a low energy level.

The following examples serve to explain embodiments of the present invention in more detail. These examples are not to be construed as being exhaustive or exclusive as to the scope of this invention.

EXAMPLES

Example 1

GST materials were deposited by PVD on six silicon oxide substrates while a constant bias voltage of approximately 0 W, approximately 15 W, approximately 25 W, approximately 45 W, approximately 65 W, or approximately 90 W was applied to the silicon oxide substrate. The PVD deposition was conducted using an argon plasma generated in a Denton Discovery 24 Sputtering system and a $Ge_2Sb_2Te_5$ deposition target. The PVD deposition chamber was maintained at 10 mTorr, and 150 W RF power was applied to the $Ge_2Sb_2Te_5$ deposition target during the deposition. The relative amounts of Ge, Sb, and Te were measured by inductively coupled plasma ("ICP") spectrometry.

Figure 14:
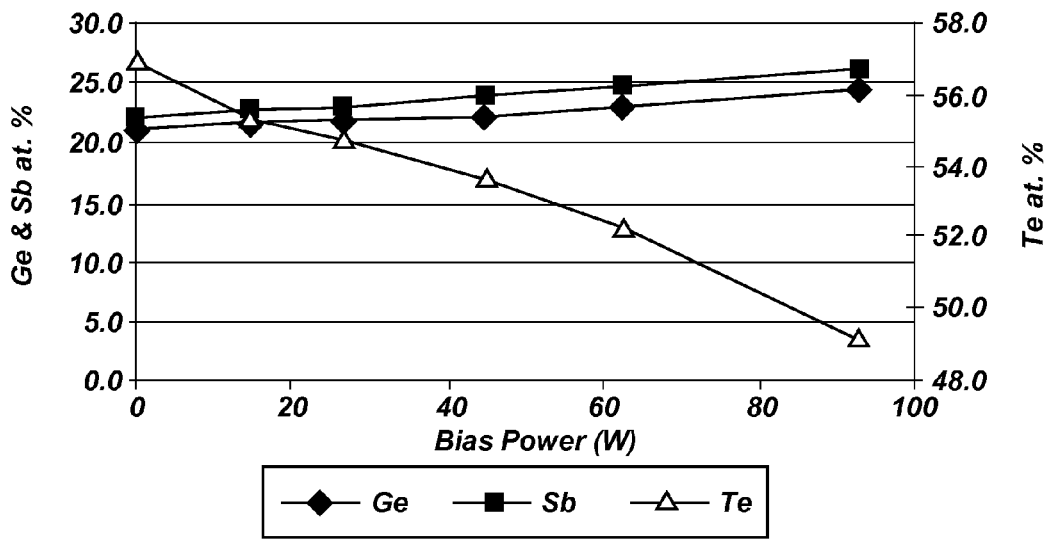
FIG. 14 is a graph illustrating the effect of increasing bias voltage applied to a substrate on the stoichiometry of a GST material formed on the substrate.

As shown in FIG. 14, the GST material deposited at 0 W had approximately 57 atomic percent Te, approximately 20 atomic percent Ge, and approximately 22 atomic percent Sb. At approximately 15 W, the GST material had approximately 55 atomic percent Te, approximately 21 atomic percent Ge, and approximately 23 atomic percent Sb. At approximately 25 W, the GST material had approximately 55 atomic percent Te, approximately 21 atomic percent Ge, and approximately 23 atomic percent Sb. At approximately 45 W, the GST material had approximately 53 atomic percent Te, approximately 22 atomic percent Ge, and approximately 24 atomic percent Sb. At approximately 65 W, the GST material had approximately 52 atomic percent Te, approximately 23 atomic percent Ge, and approximately 25 atomic percent Sb. At approximately 95 W, the GST material had approximately 49 atomic percent Te, approximately 24 atomic percent Ge, and approximately 26 atomic percent Sb. As shown in FIG. 14, at higher bias voltages compared to lower bias voltages, the amount of Te present in the GST material was reduced. However, the relative amounts of Sb and Ge were substantially unchanged regardless of the bias voltage.

Example 2

GST materials were deposited by PVD on silicon oxide substrates while a constant bias voltage of 0 W or of 250 W was applied to the silicon oxide substrate. The PVD deposition was conducted using an argon plasma generated in an ENTRON® system and a $Ge_2Sb_2Te_5$ deposition target. The PVD deposition chamber was maintained at 3 mTorr, and 1 KW RF power was applied to the $Ge_2Sb_2Te_5$ deposition target during the deposition. The relative amounts of Ge, Sb, Te, nitrogen (N), oxygen (O), and silicon (Si) were measured by X-ray photoelectron spectroscopy ("XPS").

Figure 15:
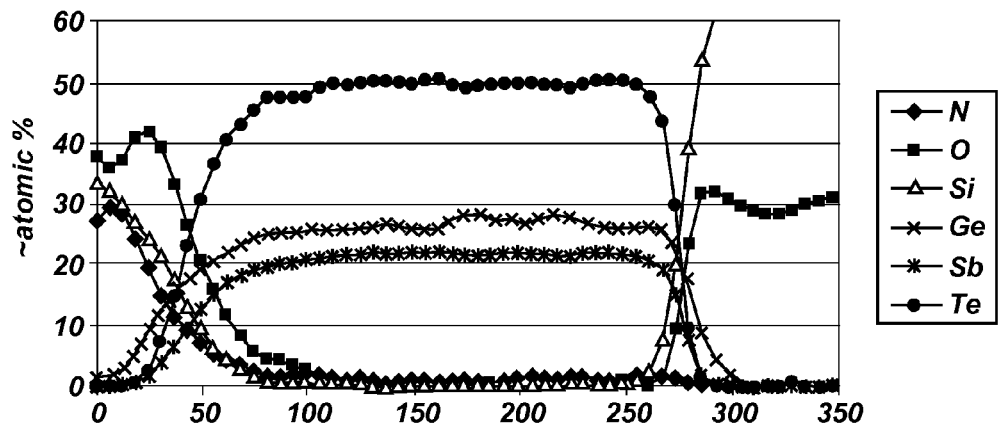
FIGS. 15 and 16 are graphs illustrating the effect of no bias voltage (FIG. 15) versus a bias voltage of 250 W (FIG. 16) applied to the substrate on the stoichiometry of a GST material formed on the substrate.
Figure 16:
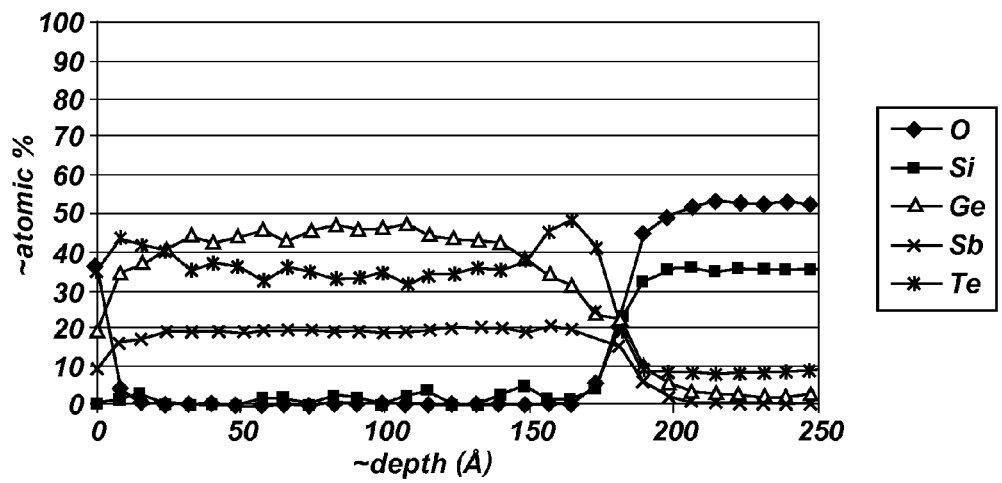

As shown in FIG. 15, the GST material formed when no bias voltage was applied to the silicon oxide substrate during the PVD deposition included approximately 50 atomic percent Te, as measured by XPS. In contrast and as shown in FIG. 16, the GST material formed when a bias voltage of 250 W was applied to the silicon oxide substrate during the PVD deposition included approximately 34 atomic percent Te, as measured by XPS.

The relative amounts of Ge, Sb, and Te were also measured by ICP. The GST material formed when no bias voltage was applied included 23.5 atomic percent Ge, 22.7 atomic percent Sb, and 53.8 atomic percent Te. The resistivity of this GST material was 51.1 mohm-cm. The GST material formed when a bias voltage of 250 W was applied included 28.4 atomic percent Ge, 27.1 atomic percent Sb, and 44.6 atomic percent Te. The resistivity of this GST material was 14.4 mohm-cm.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A method of forming a phase change material, the method comprising:
   introducing a substrate to a chamber in which a deposition target is disposed, the deposition target comprising a chalcogenide material; and
   subjecting the substrate to a bias voltage while exposing the substrate to a plasma in the chamber to form on the substrate another chalcogenide material having a stoichiometry differing from a stoichiometry of the chalcogenide material of the deposition target.

2. The method of claim 1, wherein introducing a substrate to a chamber in which a deposition target is disposed comprises introducing the substrate to the chamber in which a deposition target comprising $Ge_2Sb_2Te_5$ or $Ge_1Sb_4Te_7$ is disposed.

3. The method of claim 1, wherein subjecting the substrate to a bias voltage while exposing the substrate to a plasma in the chamber comprises forming on the substrate another chalcogenide material having a lower atomic percent of a chalcogen ion than the atomic percent of the chalcogen ion in the chalcogenide material of the deposition target.

4. The method of claim 3, wherein subjecting the substrate to the bias voltage while exposing the substrate to the plasma in the chamber comprises forming on the substrate another chalcogenide material having less tellurium than the chalcogenide material of the deposition target.

5. The method of claim 1, wherein subjecting the substrate to a bias voltage while exposing the substrate to a plasma in the chamber comprises subjecting the substrate to a constant bias voltage while exposing the substrate to the plasma in the chamber.

6. The method of claim 1, wherein subjecting the substrate to a bias voltage while exposing the substrate to a plasma in the chamber comprises subjecting the substrate to a step-wise bias voltage while exposing the substrate to the plasma in the chamber.

7. The method of claim 1, wherein subjecting the substrate to a bias voltage while exposing the substrate to a plasma in the chamber comprises applying the bias voltage to a chuck supporting the substrate while exposing the substrate to the plasma in the chamber.

8. The method of claim 1, wherein subjecting the substrate to a bias voltage while exposing the substrate to a plasma in the chamber comprises subjecting the substrate to the bias voltage while exposing the substrate to a plasma comprising at least one of helium, argon, krypton, xenon, and radon.

9. The method of claim 1, wherein subjecting the substrate to a bias voltage while exposing the substrate to a plasma in the chamber comprises subjecting the substrate to the bias voltage while exposing the substrate to a plasma comprising nitrogen.

10. A method of forming a phase change material, the method comprising:
    forming a region of a phase change material using a deposition target; and
    forming another region of the phase change material using the deposition target, the region of the phase change material and the another region of the phase change material having different stoichiometries of elements of the phase change material.

11. The method of claim 10, wherein forming a region of a phase change material using a deposition target comprises depositing a chalcogenide material on a substrate using the deposition target as a source for the chalcogenide material.

12. The method of claim 11, wherein depositing a chalcogenide material on a substrate comprises depositing by physical vapor deposition the chalcogenide material on the substrate.

13. The method of claim 10, wherein forming a region of a phase change material using a deposition target comprises forming the region of the phase change material on a substrate using the deposition target, the region of the phase change material and the deposition target having different atomic percentages of a chalcogen ion.

14. The method of claim 10, wherein forming a region of a phase change material using a deposition target comprises:
    depositing on a substrate an amount of a deposition material having upon deposition a stoichiometry of elements matching that of a chalcogenide material of the deposition target; and
    applying a bias voltage to the substrate to alter the stoichiometry of the amount of the deposition material to form the region of the phase change material.

15. The method of claim 14, wherein forming another region of the phase change material using the deposition target comprises:
    depositing on the region of the phase change material another amount of the deposition material having upon deposition the stoichiometry of elements matching that of the chalcogenide material of the deposition target; and
    applying an additional bias voltage to the substrate to alter the stoichiometry of the another amount of the deposition material to form the another region of the phase change material on the region of the phase change material.

16. A method of forming a phase change material, the method comprising:
    forming a region of a chalcogenide material on a substrate while subjecting the substrate to a bias voltage; and
    altering the bias voltage to form another region of the chalcogenide material on the substrate, the region of the chalcogenide material and the another region of the chalcogenide material having different stoichiometries.

17. The method of claim 16, wherein forming a region of a chalcogenide material on a substrate while subjecting the substrate to a bias voltage comprises forming the region of a chalcogenide material having an empirical formula of $Ge_xSb_{100-(x+y)}Te_y$, wherein x ranges from approximately 5 atomic percent to approximately 60 atomic percent and y ranges from approximately 20 atomic percent to approximately 70 atomic percent.

18. The method of claim 16, wherein forming a region of a chalcogenide material on a substrate while subjecting the substrate to a bias voltage comprises forming a chalcogenide compound comprising a chalcogen ion selected from the group consisting of oxygen, sulfur, selenium, tellurium, and polonium and at least one electropositive element selected from the group consisting of nitrogen, silicon, nickel, gallium, germanium, arsenic, silver, indium, tin, antimony, gold, lead, and bismuth.

19. The method of claim 16, wherein forming a region of a chalcogenide material on a substrate while subjecting the substrate to a bias voltage comprises forming the region of the chalcogenide material on the substrate while simultaneously subjecting the substrate to the bias voltage and a plasma.

20. The method of claim 16, wherein forming a region of a chalcogenide material on a substrate while subjecting the substrate to a bias voltage comprises forming the region of the chalcogenide material on the substrate while subjecting the substrate to a bias voltage of from approximately 25 W to approximately 200 W.

* * * * *

UNITED STATES PATENT AND TRADEMARK OFFICE
CERTIFICATE OF CORRECTION

PATENT NO. : 8,481,359 B2
APPLICATION NO. : 13/613971
DATED : July 9, 2013
INVENTOR(S) : Keith R. Hampton It is certified that error appears in the above-identified patent and that said Letters Patent is hereby corrected as shown below:

In the Claims:

In column 13, lines 25-26, in Claim 4, delete "chalocogenide" and insert -- chalcogenide --, therefor.

In column 14, line 42, in Claim 17, delete " $Ge_xSb_{100-(x+y)}Te_y$ " and insert -- $Ge_xSb_{100-(x+y)}Te_{y'}$ --, therefor.

Signed and Sealed this
Eighth Day of October, 2013

Teresa Stanek Rea
*Deputy Director of the United States Patent and Trademark Office*